US010408411B2

(12) United States Patent
Schwaiger

(10) Patent No.: US 10,408,411 B2
(45) Date of Patent: Sep. 10, 2019

(54) ILLUMINATION DEVICE INCLUDING SEMICONDUCTOR PRIMARY LIGHT SOURCES AND AT LEAST ONE LUMINOPHORE ELEMENT

(71) Applicant: OSRAM GmbH, Munich (DE)

(72) Inventor: Stephan Schwaiger, Herbrechtingen (DE)

(73) Assignee: OSRAM GmbH, Munich (DE)

( * ) Notice: Subject to any disclaimer, the term of this patent is extended or adjusted under 35 U.S.C. 154(b) by 14 days.

(21) Appl. No.: 15/568,492

(22) PCT Filed: Apr. 7, 2016

(86) PCT No.: PCT/EP2016/057574
§ 371 (c)(1),
(2) Date: Oct. 23, 2017

(87) PCT Pub. No.: WO2016/169772
PCT Pub. Date: Oct. 27, 2016

(65) Prior Publication Data
US 2018/0156409 A1 Jun. 7, 2018

(30) Foreign Application Priority Data
Apr. 24, 2015 (DE) .......... 10 2015 207 560

(51) Int. Cl.
*F21V 11/00* (2015.01)
*F21S 41/675* (2018.01)
(Continued)

(52) U.S. Cl.
CPC ............. *F21S 41/675* (2018.01); *B60Q 1/14* (2013.01); *F21K 9/64* (2016.08); *F21S 41/14* (2018.01);
(Continued)

(58) Field of Classification Search
CPC ........ F21S 41/675; F21S 41/663; F21S 41/14; F21S 41/16; F21S 41/285; F21S 41/32; F21K 9/64
See application file for complete search history.

(56) References Cited

U.S. PATENT DOCUMENTS

2009/0046474 A1  2/2009  Sato et al.
2013/0058114 A1  3/2013  Reiners
(Continued)

FOREIGN PATENT DOCUMENTS

DE  10 2010 028 949 A1  11/2011
DE  10 2012 203 442 A1   9/2013
(Continued)

OTHER PUBLICATIONS

German Search Report based on application No. 10 2015 207 560.5 (7 pages) dated Jan. 28, 2016 (for reference purpose only).
(Continued)

*Primary Examiner* — Matthew J. Peerce

(57) ABSTRACT

An illumination device includes multiple semiconductor primary light sources for emitting respective primary light beams, at least one movable mirror, which can be illuminated by means of the primary light beams, and which can assume at least two angle positions, and a luminophore element, which can be illuminated by means of primary light beams deflected by the at least one mirror. Light spots of the individual primary light beams are locally differentiable on the at least one luminophore element, an overall light spot composed of the light spots of the individual primary light beams is locally differentiable on the at least one luminophore element depending on the angle position of the at least one movable mirror, and at least one beam property of at
(Continued)

least one primary light beam incident on the at least one luminophore element is variable during operation of the illumination device.

20 Claims, 6 Drawing Sheets

(51) Int. Cl.
*H01S 5/00* (2006.01)
*F21S 41/14* (2018.01)
*F21S 41/663* (2018.01)
*F21S 41/16* (2018.01)
*F21K 9/64* (2016.01)
*F21S 41/20* (2018.01)
*F21S 41/32* (2018.01)
*B60Q 1/14* (2006.01)
*H01S 5/40* (2006.01)
*F21Y 115/30* (2016.01)

(52) U.S. Cl.
CPC ............ *F21S 41/16* (2018.01); *F21S 41/285* (2018.01); *F21S 41/32* (2018.01); *F21S 41/663* (2018.01); *H01S 5/005* (2013.01); *F21Y 2115/30* (2016.08); *H01S 5/0071* (2013.01); *H01S 5/4025* (2013.01)

(56) References Cited

U.S. PATENT DOCUMENTS

| 2014/0029282 | A1 | 1/2014 | Ravier et al. |
| 2015/0049457 | A1* | 2/2015 | Kroell ................ G01N 21/8806 362/84 |
| 2015/0176809 | A1 | 6/2015 | Schwaiger et al. |
| 2015/0369437 | A1 | 12/2015 | Reinprecht et al. |
| 2015/0369440 | A1 | 12/2015 | Reinprecht et al. |

FOREIGN PATENT DOCUMENTS

| DE | 10 2013 226 622 A1 | 6/2015 |
| JP | 2009224039 A | 10/2009 |
| WO | 2014121314 A1 | 8/2014 |
| WO | 2014121315 A1 | 8/2014 |

OTHER PUBLICATIONS

International Search Report based on application No. PCT/EP2016057574 (5 pages + 2 pages English translation) dated Jun. 27, 2016 (for reference purpose only).

* cited by examiner

ILLUMINATION DEVICE INCLUDING SEMICONDUCTOR PRIMARY LIGHT SOURCES AND AT LEAST ONE LUMINOPHORE ELEMENT

RELATED APPLICATIONS

The present application is a national stage entry according to 35 U.S.C. § 371 of PCT application No.: PCT/EP2016/057574 filed on Apr. 7, 2016, which claims priority from German application No.: 10 2015 207 560.5 filed on Apr. 24, 2015, and is incorporated herein by reference in its entirety.

TECHNICAL FIELD

The present disclosure relates to an illumination device, including multiple semiconductor primary light sources for emitting respective primary light beams, at least one movable mirror which can be illuminated by means of the primary light beams and which can assume at least two angle positions, and at least one luminophore element, which can be illuminated by means of primary light beams deflected by the mirror. The present disclosure is applicable, for example, to projection devices, in particular vehicle headlights or devices for professional illumination, for example, for effect illumination, for example, as a stage floodlight or as a disco light.

BACKGROUND

Simple headlights in the automotive field presently offer the selection between multiple fixedly defined light distributions, for example, low beams, high beams, and fog lights.

So-called "adaptive" headlight systems having variable light distributions supplement this selection and offer, for example, dynamic cornering lights, freeway, city, and bad weather lights. The selection of the light distributions is partially performed depending on the situation by the headlight system and/or the central electronics of the vehicle.

So-called "active" headlights also exist in the field of vehicle illumination, in which a limited number of pixels arranged in columns can be generated. Using active headlights it is possible, for example, to mask oncoming and leading vehicles within their own high beam cone ("dazzle-free high beams") or to emphasize sources of risk by direct illumination for the driver. One possible technical implementation of an active headlight is based on a luminophore which can be excited by means of laser radiation. The luminophore is "scanned" in this case using the exciting radiation and then imaged with the aid of a projection optical unit. The principle is described, for example, in the documents DE 10 2010 028 949 A1, US 2014/0029282 A1, and WO 2014/121314 A1. These documents describe that dynamically adaptable light distributions are generated on the luminophore in that the laser radiation used for exciting the luminophore is regulated with the aid of a controllable light deflection unit in the form of a movable micromirror. A desired light distribution can be achieved in this case (as described in US 2014/0029282 A1), via an intensity modulation of the laser source, via an adaptation of the angular velocity of the deflection unit, and also via a combination of both mechanisms.

The luminophores necessary for the wavelength conversion or conversion of the laser light are limited because of the so-called "thermal quenching" with respect to the conversion rate thereof and/or a maximum acceptable power density (for example, because of the physical material properties thereof such as a resistance to "laser ablation") and therefore are limited with respect to the maximum luminance thereof. This limit of the luminance limits the resulting luminous flux per cross-sectional area of the luminophore element illuminated (by the laser beam). To achieve the luminous flux required for a headlight, for example, a minimum illuminated area on the luminophore element and therefore a minimum cross-sectional area of the laser beam is therefore necessary. While the luminous flux increases with increasing beam diameter (with constant power density of the beam), the achievable resolution decreases. A goal conflict thus exists between the resolution and the achievable luminous flux. An increase of the resolution causes a reduction of the luminous flux per pixel and vice versa. The only possibility for avoiding the negative consequences of the luminance limiting of the luminophore, without reducing the resolution, is to distribute the luminous flux onto multiple laser beams. The technical implementations thereof have the disadvantage that they result in a high alignment expenditure and require a large amount of installation space for the arrangement of the light sources and/or the deflection units.

SUMMARY

It is the object of the present disclosure to at least partially overcome the disadvantages of the prior art and in particular to provide a compact illumination device, which enables a high resolution with high luminous flux, without a large amount of control and/or alignment expenditure.

This object is achieved according to the features of the independent claims. Preferred embodiments can be inferred from the dependent claims in particular.

The object is achieved by an illumination device, including multiple semiconductor primary light sources for emitting respective primary light beams, at least one movable mirror, which can be illuminated by means of the primary light beams and which can assume at least two positions, in particular angle positions, and a luminophore element, which can be illuminated by means of primary light beams deflected by the at least one mirror, wherein—in at least one angle position—light spots of the individual primary light beams (also referred to as "individual light spots") are locally differentiable on the at least one luminophore element, an overall light spot composed of the individual light spots is locally differentiable on the at least one luminophore element depending on the angle position of the at least one mirror, and at least one beam property of at least one primary light beam incident on the at least one luminophore element is variable during operation of the illumination device.

By means of this illumination device, it is possible to achieve a high resolution, since not only a position of the overall light spot on the luminophore element is locally variable, but also the individual primary light beams (or "individual light beams") can be varied by turning them on and off, for example, also depending on a position of the overall light spot. Furthermore, a control and alignment of the at least one mirror and/or the semiconductor primary light sources is thus simplified. In particular, the individual primary light beams (which can also be referred to as "individual primary light beams" or "individual beams") can now be deflected onto the luminophore with a relatively small alignment effort, without reducing the resolution or the luminous flux at the same time. A further advantage is that the alignment of the individual semiconductor primary light sources in relation to one another no longer has to be performed on the system level, but rather can already take place at the producer of the semiconductor primary light sources.

The overall light spot (and therefore also an overall light beam composed of the individual primary light beams) is thus segmented per se and/or partially switchable due to the individual beams and is thus variable in manifold ways. It is thus possible, inter alia, to dynamically adapt an intensity profile of useful light emitted by the luminophore or a light emission pattern emitted by the illumination device with particularly fine resolution using a small structural expenditure. At least two individual light spots can overlap or be separate in this case. The segmenting ability of the overall light spot thus does not necessarily also mean a sharp separation of the individual light spots from one another. The overall light spot can fundamentally—for example, also depending on an angle position of the mirror—be a single coherent light spot or have multiple luminescent subregions which are spatially separated from one another. The spatially separated luminescent subregions can each in turn be composed of multiple individual light spots.

In this illumination device, at least one overall light spot, which is composed of all light spots of the individual primary light beams, can thus be moved by means of the at least one mirror uniformly on the luminophore element, while the beam property (properties) of at least some individual primary light beams are selectively variable.

The variability of the at least one beam property includes that at least one individual primary light beam cannot only be turned on and off, but rather optionally at least two different beam properties are settable at least upon incidence on the luminophore element. This can be achieved by a different control of the respective semiconductor primary light source and/or by a different (geometrical and/or spectral) beam shaping of the individual primary light beam emitted from the respective semiconductor light source.

In one refinement, the illumination device can vary the beam property (properties) of all primary light beams, which enables a particularly multifaceted setting of the light emission pattern. Alternatively, the illumination device can also have at least one primary light beam which is not variable in this manner, but which can simply be turned on and off, for example.

The luminophore element can be provided or used in a reflective arrangement and/or in a transmitting arrangement. In the reflective arrangement, the light emitted from the luminophore element is used as useful light, which is emitted from the side of the luminophore element on which the primary light beams are incident. In the transmitting arrangement, the light emitted from the luminophore element is used as the useful light which is emitted from the side of the luminophore element facing away in relation to the incident primary light beams. In particular, an arrangement which is both reflective and also transmitting is also implementable. Above all in a transmitting arrangement, further optical elements, for example, dichroic mirrors, are implementable to increase the efficiency.

The luminophore element has at least one luminophore, which is suitable for at least partially converting incident primary light into secondary light of a different wavelength. If multiple luminophores are provided, this secondary light may be generated in wavelengths different from one another and/or the secondary light may be generated by primary light of different wavelengths. The wavelength of the secondary light may be longer (so-called "down conversion") or shorter (so-called "up conversion") than the wavelength of the primary light. For example, blue primary light may be converted by means of a luminophore into green, yellow, orange, or red secondary light. In the case of only partial wavelength conversion, a mixture of secondary light (for example, yellow) and nonconverted primary light (for example, blue) is emitted by the luminophore element, which can be used as useful light (for example, white).

The luminophore element can be a (flat) luminophore plate, for example, in the form of a ceramic. The luminophore plate can be planar at least on the surface which can be irradiated by the primary light beams. The luminophore plate can have a constant or a varying thickness. For example, it can have a round or quadrangular edge contour.

Alternatively or additionally, the luminophore plate can also be embodied as nonplanar, for example, bulging or undulating, at least on the surface which can be irradiated by the primary light beams.

The luminophore element can be a single, coherently produced luminophore element, which can also be referred to as an integral luminophore element. Alternatively, the luminophore element can be assembled from separately produced partial segments, which are offset and/or twisted and/or inclined and/or tilted in relation to one another, wherein the partial segments can be arranged on a common plane, but do not have to be.

These partial segments or partial luminophore elements can have identical or different conversion properties (for example, with respect to a degree of conversion, a luminophore used, etc.). If multiple partial luminophore elements are provided, at least two thereof can border one another closely, for example, abut one another.

The fact that light spots of the primary light beams or individual light spots are locally differentiable on the at least one luminophore element can also be referred to as a "laterally disjointed" or simply only as a "disjointed" arrangement. The disjointed arrangement includes that adjacent light spots are laterally separated from one another or only partially overlap. The disjointed arrangement is in particular provided in that locations of maximum luminance and/or centers of adjacent light spots are not coincident on one another, but rather are laterally spaced apart from one another. A center of the light spot may be understood in particular as a geometrical focal point (possibly weighted in the luminance).

In one refinement, at least two primary light beams or individual light spots on the at least one luminophore element are locally differentiable and at least two primary light beams or individual light spots on the at least one luminophore element lie directly on top of one another. Individual light spots "lying directly on top of one another" in particular have the same geometrical focal point. Individual light spots lying directly on top of one another can have identical or different properties (for example, diameter). By using individual light spots lying directly on top of one another, an even greater variation of the luminance distribution on the luminophore element and therefore the light emission pattern may be achieved.

An overlap is provided in particular if edges of adjacent light spots overlap. An edge of one light spot can enclose, for example, the region in which a luminosity of at least 5%, in particular at least 10%, in particular at least $1/e^2$ (corresponding to approximately 13.5%), in particular $1/e$ (corresponding to approximately 36.8%), of the maximum luminance of this light spot is achieved. Similarly, an arrangement separate from one another is achieved if the edges do not overlap.

In particular, the at least one semiconductor primary light source includes at least one laser, for example, at least one laser diode. The laser diode can be provided in the form of at least one individually housed laser diode or in unhoused form, for example, as at least one chip or "die". In particular, multiple laser diodes can be provided as at least one multi-die package or has at least one laser bar. For example, the Multi-Die Laser Package PLPM4 450 from Osram Opto Semiconductors can be used. Multiple chips can be mounted on a common substrate ("submount"). Instead of a laser, for example, at least one light-emitting diode can also be used.

In one refinement, the at least one semiconductor primary light source has at least four, in particular at least 20, in particular at least 30, in particular at least 40 semiconductor primary light sources. The higher the number of the semiconductor primary light sources, the higher an achievable luminosity in the far field and the lower the demands which have to be applied to a movement of the at least one mirror.

In one refinement, at least one semiconductor primary light source is selectively controllable. This includes, of multiple semiconductor primary light sources, at least one semiconductor primary light source being controllable individually and/or in groups. It is an advantageous refinement for a particularly multifaceted formation of a useful light beam that all semiconductor primary light sources are individually controllable. At least one semiconductor primary light source may be controllable individually or in groups.

In a further refinement, the semiconductor primary light sources are configured to emit all primary light beams in parallel to one another. This may be achieved, for example, by an attachment of the semiconductor primary light sources on one or multiple common carriers. In particular for this refinement, all semiconductor primary light sources can be arranged on a common carrier, in particular a printed circuit board, for example, as at least one multi-die package or as at least one laser bar.

In a further refinement, the semiconductor primary light sources are arranged in a regular surface pattern, in particular in a symmetrical surface pattern, for example, in a rectangular matrix pattern or in a hexagonal pattern. This results in the advantage that a set of all individual light spots which can be generated during an image buildup time on the luminophore element can also be formed regularly, in particular symmetrically, in a simple manner. Thus, in particular undesired luminance jumps or an undesired luminance gap between adjacent light spots can be avoided.

The at least one movable mirror may include in particular at least one rotatable or pivotable mirror, but can additionally or alternatively be displaceable, however.

In one refinement, the at least one movable mirror is precisely one mirror, which enables a particularly simple construction. Such a mirror is pivotable or rotatable in particular about two rotational axes perpendicular to one another, for example, about an x axis and about a y axis. A fundamentally arbitrary position of the overall light spot on the luminophore element is thus enabled using only one mirror, for example, a line-by-line or column-by-column illumination or an illumination, which is built up like a Lissajous figure, of the luminophore element. A generation line-by-line or column-by-column or like a Lissajous figure of a light emission pattern built up by the useful light is thus in turn enabled.

In another refinement, the at least one movable mirror includes multiple movable mirrors. These can each deflect the primary light beams in different spatial directions, for example, for a line-by-line or column-by-column buildup of the light emission pattern, for example. Thus, in one refinement, the at least one movable mirror which can be illuminated by means of the primary light beams includes one rotatable mirror per rotational axis, for example, one rotatable mirror for the x axis and one downstream rotatable mirror for the y axis, or vice versa. Such mirrors are implementable particularly simply.

A first optical unit in the form of a "primary optical unit" can be connected downstream from the multiple semiconductor primary light sources, which individually beam-shapes, for example, collimates the individual primary light beams emitted by the semiconductor primary light sources. The primary optical unit can beam-shape the individual primary light beams identically or differently.

A second optical unit having at least one optical element can be arranged in the light path between the multiple semiconductor primary light sources or—if provided—the first primary optical unit and the at least one movable mirror. A third optical unit having at least one optical element can be arranged in the light path between the at least one movable mirror and the at least one luminophore element. A fourth optical unit having at least one optical element for beam shaping of the useful light can be optically downstream from the at least one luminophore element. The third optical unit and the fourth optical unit can have at least one common optical element, for example, at least one optical element for focusing the primary light beams on the luminophore element and for decoupling the useful light emitted by the luminophore element.

In another refinement, the second optical unit is configured and designed to deflect at least two individual primary light beams emitted by the semiconductor primary light sources at different angles onto the at least one mirror. A particularly small mirror can thus be used, in particular a micromirror. The second optical unit can be configured and arranged in particular to focus multiple parallel incident primary light beams on the mirror. In a refinement thereof, the primary light beams are intentionally defocusable, for example, by a corresponding movement of the first optical unit and/or the second optical unit and/or the third optical unit and/or the fourth optical unit. The defocusing ability can be implemented, for example, so that the individual primary light beams can be guided in such a way that the common focal point thereof is located in front of or behind the at least one mirror, possibly even in front of or behind the luminophore element. The primary light beams can be intentionally guided convergently or divergently for this purpose.

In another refinement, the second optical unit is configured and arranged to guide two individual primary light beams emitted by the semiconductor primary light sources in parallel to one another, but laterally disjointed onto the at least one mirror.

In a general refinement, the primary light beams are emitted by the semiconductor primary light sources in parallel to one another. This can be the case, for example, upon a use of multi-die packages or laser bars.

In one embodiment, a beam property is an irradiance of at least one individual light spot. The luminance thereof on the luminophore element can thus be intentionally set. A "single light spot" can be understood hereafter as the region illuminated by an individual primary light beam on the at least one luminophore element. The irradiance can be in particular a chronologically averaged irradiance. It can have, for example, the unit $W/m^2$.

The setting of the irradiance of the primary light beam and/or its dimming ability can be achieved, for example, by way of amplitude modulation and/or pulse width modulation, for example, by a corresponding control of the associated semiconductor primary light source. The luminance of the associated light spot is thus varied similarly.

This embodiment in particular includes that at least one individual primary light beam is dimmable. In particular, all individual beams can be dimmable individually or in groups. The at least one individual primary light beam may be dimmable continuously or in individual steps.

In a further embodiment, all individual primary light beams are variable with a dimming factor dependent on the angle position of the at least one mirror. The dimming factor can thus change between at least two angle positions. This can be used, for example, for the purpose of compensating for a luminance change on the luminophore element dependent on an angle position of the at least one mirror (for example, by angle-dependent different irradiances, for example, as can occur due to optical effects, for example, of the primary optical unit).

In one refinement, the dimming factor is equal in a respective angle position for all individual primary light beams, which enables a particularly simple control.

In another refinement, the dimming factor is different in a respective angle position for at least two individual primary light beams, which enables particularly precise adaptation. It is taken into consideration in this case that a dimension of the irradiance change of the individual primary light beams between two angle positions can also be dependent on a position of the individual primary light beams.

In another embodiment, a beam property is a beam area or cross-sectional area of at least one individual primary light beam. An area of the associated light spot can thus be set. This in turn can be used, for example, to set a degree of overlap of adjacent light spots and therefore also a profile of the useful light beam.

Such a setting of the beam area may include, for example, (a) a movement (for example, a displacement, a tilt, etc.) of at least one optical element (for example, a lens, a shutter, etc.) located in the light path of the primary light beam and/or (b) an addition and/or removal of at least one beam-shaping optical element to or from, respectively, the light path of the primary light beam. A change of the beam area of an individual primary light beam according to variant (a) can be achieved, for example, by defocusing, which is implementable, for example, via a corresponding setting of an optical unit located between the associated semiconductor primary light source and the luminophore element.

In still another embodiment, a beam property is an arrangement of at least two individual primary light beams in relation to one another. The arrangement includes in particular a distance and/or an angle in relation to one another. The light emission pattern emitted by the illumination device can thus be varied in even more manifold ways. A cross-sectional area of the overall light beam and therefore also the overall light spot may thus be reduced by a reduction of the distances of the individual primary light beams, and therefore also the associated individual light spots, and may be enlarged by an increase of the distances.

A setting of the arrangement, in particular the distance, of the primary light beams can be achieved, for example, by (a) a movement (for example, displacement) of at least one optical element located in the light path of the primary light beam and/or by (b) an addition and/or removal of at least one optical element to or from the light path of the primary light beam.

In one refinement, the arrangement is settable depending on an angle position of the at least one mirror. Angle effects may thus advantageously be effectively compensated for. A brightness distribution of the light emission pattern can thus also be varied over a large area.

In a general embodiment, the at least one beam property of at least one primary light beam is variable between angle positions of the at least one mirror. A particularly simple setting ability and high resolution can thus be achieved with a large illuminated area. This embodiment includes the beam property of at least one primary light beam being different in a first angle position than in a second angle position, for example, the irradiance and/or the arrangement, for example, as already described above, for example, with reference to its distance and/or its profile.

In another embodiment, the at least one movable mirror includes at least one micromirror. A particularly compact arrangement may thus be achieved. The micromirror may be a MEMS component, which can then also be referred to as a MEMS mirror. At least one micromirror may have a single coherent movable mirror surface. At least one micromirror may have multiple—in particular independent of one another—movable mirror surfaces. It may then be provided in particular as a micromirror array, for example, as a DMD ("Digital Micromirror Device").

At least one micromirror may be movable by an actuator, in particular pivotable, for example, in steps or continuously. The respective angle positions correspond in this case to the respective positions of an overall primary light beam on the at least one luminophore element or the overall light spot. The at least one associated actuator (for example, a piezo actuator with or without stroke amplification) can be designed or used as a stepping motor. Alternatively or additionally, at least one micromirror can be continuously rotatable by means of a drive shaft, specifically between two end positions or rotating through. The actuator may then be an electric motor. For example, a construction similar to a so-called "flying spot" method can be achieved using a mirror pivotable step-by-step and a continuously rotatable mirror.

In an additional embodiment, the at least one luminophore element can be illuminated in paths of an overall light beam composed of the individual primary light beams and/or the overall light spot is movable or "scannable" in paths on the luminophore element.

The path-type movement can be, for example, a line-by-line or column-by-column movement or a movement according to a Lissajous figure. A frequency required in particular in the case of a line-by-line or column-by-column movement to scan a line or column can be referred to as a "scanning frequency".

In one refinement, a beam property of the individual primary light beams is changeable with a change frequency which is at least 10 times, in particular at least 100 times, in particular at least 1000 times, in particular at least 10,000 times higher than the scanning frequency. Thus, for example, a pulse frequency of the semiconductor primary light sources can be correspondingly higher than the scanning frequency.

The duration of a cycle for illuminating the luminophore element is also referred to as an "image buildup time", and the associated frequency as an "image buildup frequency". For sufficiently high chronological resolution of a light emission pattern, also in a far field, the image buildup frequency is advantageously at least 50 Hz, particularly advantageously at least 75 Hz, very particularly advantageously at least 100 Hz, in particular at least 200 Hz.

In still another embodiment, differently positioned and therefore in particular also successively generated overall light spots overlap on the at least one luminophore element, namely in a so-called "overlap region" of the luminophore element. A particularly high chronologically integrated luminance can be achieved there. In other words, in this embodiment overall light spots associated with different angle positions of the at least one mirror can overlap.

In a refinement thereof, in the overlap region, individual light spots of different overall light beams are superimposed chronologically offset, but congruently. In other words, at least two light spots of individual primary light beams, which are associated with different overall light spots, can be superimposed. A light pattern which can be generated in particularly multifaceted ways can thus be provided on the luminophore element and by the light emission pattern emittable from the illumination device. In particular, a dimming ability of individual light regions in an overlap region of the luminophore element can thus also be achieved if the associated individual light beams are not dimmable, but rather can only be turned on and off, for example. A particularly high resolution may also thus be achieved.

In still another embodiment thereof, at least two rows (for example, columns or lines) of light spots of individual primary light beams, which are associated with different overall light spots, can be superimposed. A high resolution and a high chronologically integrated luminance are thus enabled in a particularly simple way for, for example, line-by-line or column-by-column overscoring or scanning of the luminophore element.

In an advantageous embodiment for a particularly mechanically simple and rapidly switching movement mechanism of the at least one mirror, the overall light spots—associated with different angle positions—are locally separated from one another.

In one refinement, the entirety of the locally differentiable individual light spots which can be generated on the luminophore element form a regular pattern, for example, a matrix pattern. In this case, in particular each of the light spots may be individually variable with respect, for example, to its luminance, luminance distribution, shape, and/or extension.

In a further embodiment, the overall light spot has a maximum achievable planar extension which does not exceed 20% of a corresponding extension of the luminophore element or the area thereof which can be illuminated, in particular does not exceed 10%, in particular 5%, in particular 2%, and in particular 1%. A particularly high luminance of the light spots can thus be achieved. By way of the change of the angle position of the at least one mirror, multiple disjointed overall light spots may be generated within one illumination cycle or within one image buildup time, which together cover more than 20% (in particular 10%, 5%, 2%, or 1%) of the corresponding extension of the luminophore element. A planar extension can be understood, for example, as a diameter (for example, in the case of an overall light spot having a round base shape), an edge length, or a diagonal (for example, in the case of an overall light spot having a rectangular or hexagonal base shape).

The extension and/or the shape of the overall light spot may be given in particular by the extension and/or the shape of an envelope contour of the overall light spot. The envelope contour can be in particular the imaginary line of minimal length which encloses all individual light spots of an overall light spot. It encloses a closed area, in which all individual light spots are located. In the case of a rectangular matrix-shaped arrangement of the individual light spots, the associated envelope contour may have a rectangular base shape, etc. The shape of the overall light spot or the shape of its envelope contour having a specific (for example, rectangular, hexagonal, circular, oval, free-form, etc.) base shape may include at least a part of the edges being formed curved, the base shape having rounded edges, for example.

In an advantageous embodiment for avoiding light losses, at least one individual primary light beam is incident at a Brewster angle on the luminophore element, because a surface reflection is thus kept particularly low.

In an additional refinement, the illumination device includes a memory or is coupled to a memory, in which a lookup table is stored, which links the angle positions of the micromirror to a beam property of the individual light spots or of the overall light spot. Therefore, at least one beam property can be assigned individually or in groups to each individual light spot, for example, an individual dimming factor. Alternatively or additionally, at least one specific beam property, for example, a common dimming factor, can be assigned to the overall light spot or all individual light spots. The linkages between the angle positions and the beam properties can be different for various applications. Thus, the illumination device can be used as a vehicle headlight, wherein different linkages for low beams, for fog lights, for high beams, etc. can be stored in the lookup table.

In a further refinement, the illumination device is coupled to at least one sensor (for example, to a camera) and the beam properties of the individual light spots and/or the overall light spot are variable depending on a measured value of the at least one sensor. Thus, in the case of a traveling vehicle, if a pedestrian or an animal has been discovered by means of a front camera, the light spots are dimmed or turned off entirely which illuminate this object in the associated light emission pattern. This reduces dazzling of the object. Alternatively thereto, the individual light spots can also be increased in the power thereof, for example, to illuminate a danger zone located in front of the vehicle. Such an adaptation of the beam property can also be referred to as "dynamic" or "active" adaptation. A further possibility for a dynamic adaptation may consist of a variation of the dimming factor depending on a value of an external light sensor. Furthermore, the possibility exists that a dynamic adaptation of the beam properties is settable or variable via an interface which interacts with the vehicle, for example, a software application ("app") or a position signal (GPS, etc.). Thus, for example, users of a vehicle can perform a beam adaptation permissible in the context of the legal standards depending on the weather conditions (fog, rain, snow, etc.) or depending on age, state of the eyes, and other preferences.

In still another embodiment, the illumination device is a projection device. This is understood in particular as a device which is provided to illuminate a region spaced apart from the projection device.

In yet another embodiment, the illumination device is a vehicle headlight or an effect illumination device (for example, a stage or a disco light). However, the illumination device can also be an image projector.

For the case of a vehicle headlight, the associated vehicle can be a motor vehicle such as a passenger automobile, a truck, a bus, a motorcycle, etc., an aircraft such as an airplane or a helicopter, or a water vehicle. The illumination device can fundamentally be a different illumination device of a vehicle, for example, a taillight.

BRIEF DESCRIPTION OF THE DRAWINGS

The above-described properties, features, and advantages of the present disclosure and the manner in which they are achieved will become clearer and more comprehensible in conjunction with the following schematic description of embodiments, which are explained in greater detail in conjunction with the drawings. In this case, identical or identically acting elements can be provided with identical reference signs for comprehensibility. In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
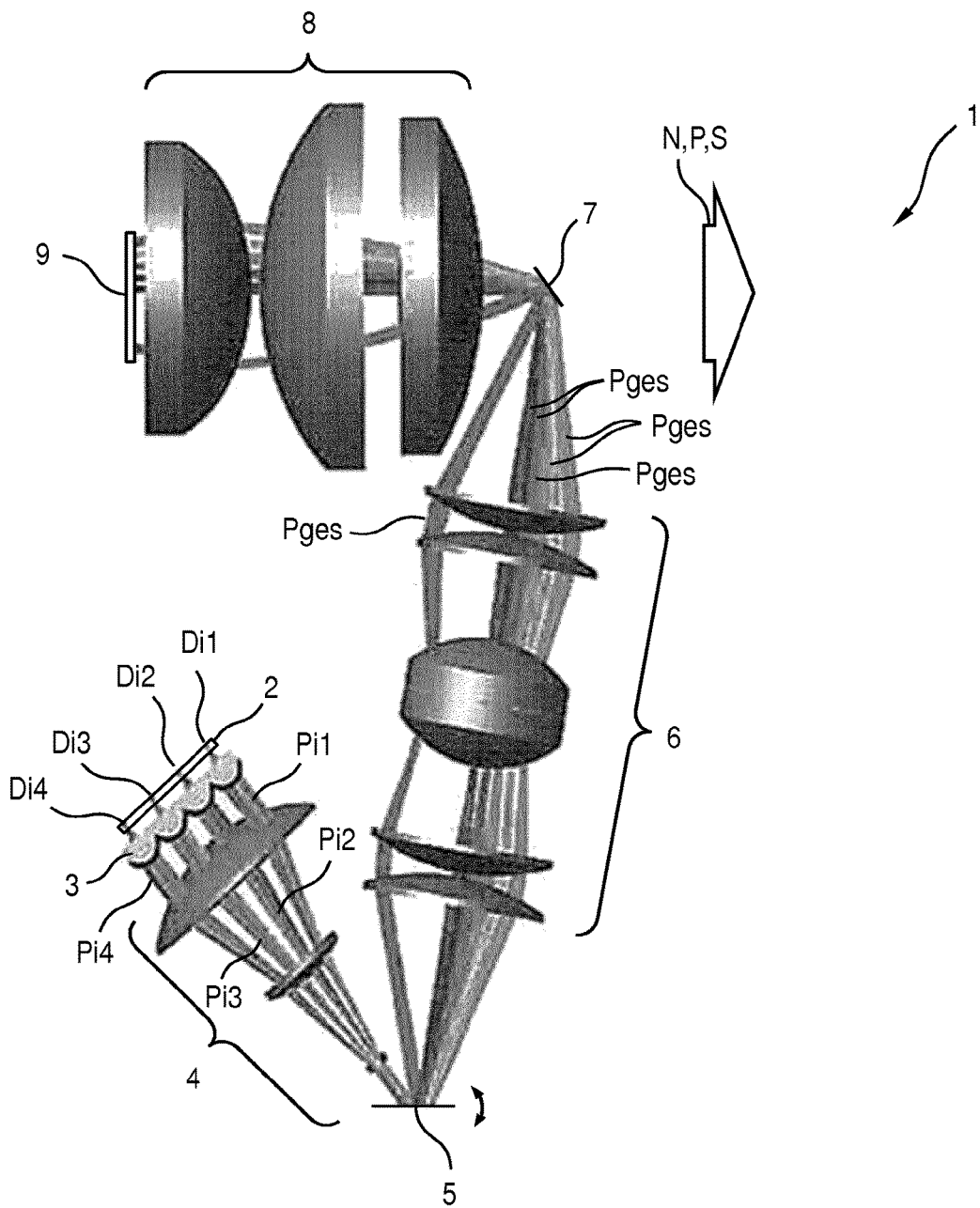
FIG. 1 shows a sectional illustration in a cross-sectional view of an illumination device according to a first embodiment.

FIG. 1 shows a sectional illustration in a cross-sectional view of an illumination device 1 according to a first embodiment.

The illumination device 1 includes a multi-die package 2, on which twenty (20) semiconductor primary light sources in the form of laser chips Dij with, for example, i=1, m and j=1, . . . , n are arranged in a matrix-shaped (m×n) pattern with m=5, n=4. The laser chips, of which only the laser chips Di1 to Di4 of a column i are shown here, emit associated individual primary light beams Pij in the form of laser beams, of which only the associated four primary light beams Pi1 to Pi4 are shown here. All primary light beams Pij consist here by way of example of blue light and are also identical with respect to the shape thereof. The primary light beams Pij are emitted in parallel to one another.

The individual primary light beams Pij pass through a first optical unit 3, which enables individual beam shaping of the individual primary light beams Pij, for example, a beam collimation, for example, for individual "parallel orientation" of all individual primary light beams Pij. The first optical unit 3 can also be referred to as a "primary optical unit". It can be adjustable in particular, for example, to vary a beam direction and/or an opening angle of the individual primary light beams Pij and/or to vary a distance of adjacent primary light beams Pij.

A second optical unit 4 common to all primary light beams Pij is connected downstream from the first optical unit 3, which brings the primary light beams Pij spatially closer together and optionally also reduces the cross-sectional area thereof and guides them onto a first mirror in the form of a micromirror 5. The second optical unit 4 can also be referred to as a "telescope optical unit". The primary light beams Pij can be incident in parallel or at an angle to one another on the micromirror 5.

The micromirror 5 can be rotated, for example, continuously or step-by-step about two rotational axes, which could lie here, for example, perpendicular to the plane of the drawing and parallel to a mirror surface of the micromirror 5 in the plane of the drawing. It can assume multiple different angle positions in relation to each of the two rotational axes. The deflection angle of the micromirror 5 can be up to +/−12° in both rotational directions, for example.

The micromirror 5 deflects the primary light beams Pij, which are now close together in an overall light beam Pges, through a third optical unit 6 onto a fixed deflection mirror 7. In FIG. 1, overall light beams Pges associated with different angle positions of the micromirror 5 are shown singled out as examples, which can be generated in chronological succession during operation of the illumination device 1.

The deflection mirror 7 deflects the individual primary light beams Pij and/or the overall light beam Pges composed thereof through a fourth optical unit 8 onto a luminophore element 9. In this case, the primary light beams Pij can be focused on the luminophore element 9 or also intentionally defocused. The fourth optical unit 8 ensures—if desired—this focusing/defocusing of the primary light beams Pij on the luminophore element 9. A diameter of the fourth optical unit 8 is advantageously 70 mm or less for automobile applications.

The luminophore element 9 is designed here as a flat ceramic plate, which can rest, for example, on a reflective underlay (not shown) on its side facing away from the incident primary light beams Pij. The underlay can also act as a heat sink.

The luminophore element 9 can also be able to be illuminated simultaneously in one angle position of the micromirror 5 maximally by all primary light beams Pij. However—in particular also depending on the angle position—one or more primary light beams Pij can also be turned off and/or not emitted.

The blue primary light beams Pij can be at least partially wavelength-converted by the luminophore located in the luminophore element 9, specifically into secondary light of at least one different wavelength, for example, of a yellow color. The luminophore element 9 emits here, from the same side on which the primary light beams Pij are also incident, the useful light N, which is composed of a primary light component P and a secondary light component S mixed ("reflective arrangement"). The fourth optical unit 8 is also used in this case as a decoupling optical unit or as a part of a decoupling optical unit for the useful light N, in particular for projection in a far field. The useful light N can be, for example, a blue-yellow or white mixed light.

The deflection mirror 7 can be part of the third optical unit 6 and/or the fourth optical unit 8, or can also not represent a component of these optical units 6, 8.

In an alternative refinement, both mirrors 5 and 7 can be rotatable mirrors having different rotational axes, in particular micromirrors. The mirror 5 thus may only be rotatable about a first rotational axis D1 and the mirror 7 may only be rotatable about a second rotational axis D2.

In still another alternative refinement, the mirror 7 can be the micromirror and the mirror 5 can be the fixed deflection mirror. This results in the advantage that the third optical unit 6 can also be omitted.

Due to the different angle positions of the micromirror 5 (or, for example, alternatively the mirror/s 5 and/or 7, etc.), all primary light beams Pij incident on the micromirror 5 can be moved jointly, whereby a corresponding movement of the associated light spot Fij on the luminophore element 9 also results. This corresponds to a modified deflection of an overall light beam Pges or the overall light spot Fges composed of the individual primary light beams Pij. An overall light spot Fges composed of the individual light spots Fij of the respective primary light beams Pij is thus locally differentiable on the at least one luminophore element 9 depending on the angle position of the micromirror 5. In other words, at different angle positions of the micromirror 5, associated overall light spots Fges differ in location on the luminophore element 9 or are arranged disjointed in relation to one another on the luminophore element 9.

In addition, at least one beam property of at least one primary light beam Pij incident on the luminophore element 9 can be varied individually or in groups during operation of the illumination device 1. Thus, the primary light beams Pij, for example, can be turned on and off individually or in groups, dimmed, and/or beam-shaped differently after emission, etc.

Figure 2:
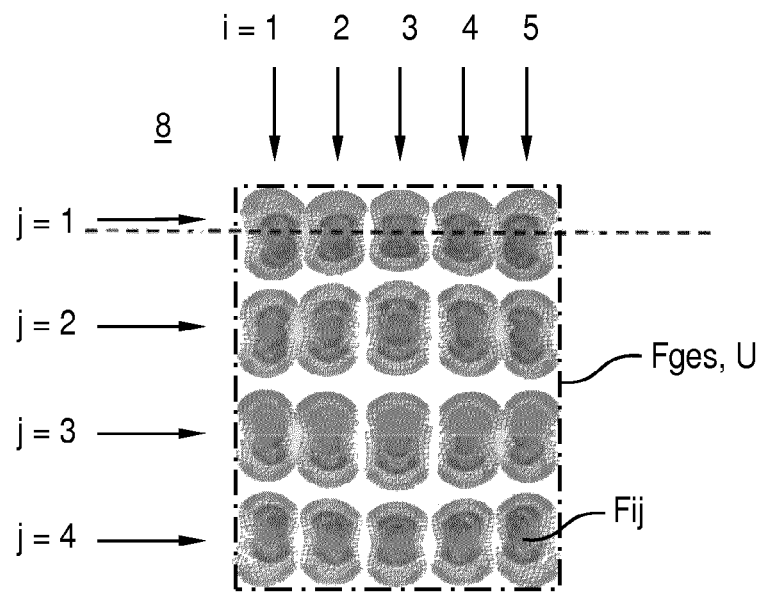
FIG. 2 shows an overall light spot on a luminophore element of the illumination device.

FIG. 2 shows a frontal view of the luminophore element 9 having all individual light spots Fij which can be generated simultaneously. The individual light spots Fij form an overall light spot Fges on the luminophore element 9 of the illumination device 1. The light spots Fij are generated by a respective primary light beam Pij.

The light spots Fij are locally differentiable on the luminophore element 9 and are shown practically not overlapping here, for example. The light spots Fij form—like the primary light beams Pij immediately before incidence on the luminophore element 9—a matrix-type (m×n)-pattern with m=5 columns and n=4 lines. The light spots Fij are practically uniform here.

The extension and/or the shape of the overall light spot Fges is determined by an envelope contour U, which encloses all individual light spots Fij with minimum length. It encloses a closed area in which all individual light spots Fij are located. In the rectangular matrix-shaped arrangement of the individual light spots Fij shown here, the associated envelope contour U has a rectangular base shape, which can optionally have rounded corners. If all light spots Fij are turned on, the associated overall light spot Fges can also be referred to as a "maximum" overall light spot Fges.

The variation of the beam property of the primary light beams Pij and therefore also the light spots Fij may relate, for example, to an irradiance or irradiance distribution of the primary light beams Pij, the cross-sectional area or area thereof, the shape thereof, and/or the arrangement thereof—in particular the distance—in relation to another—in particular adjacent—primary light beam Pij or light spot Fij, respectively, etc. The variation of the beam property can be variable in particular between different angle positions of the at least one mirror.

Figure 3:
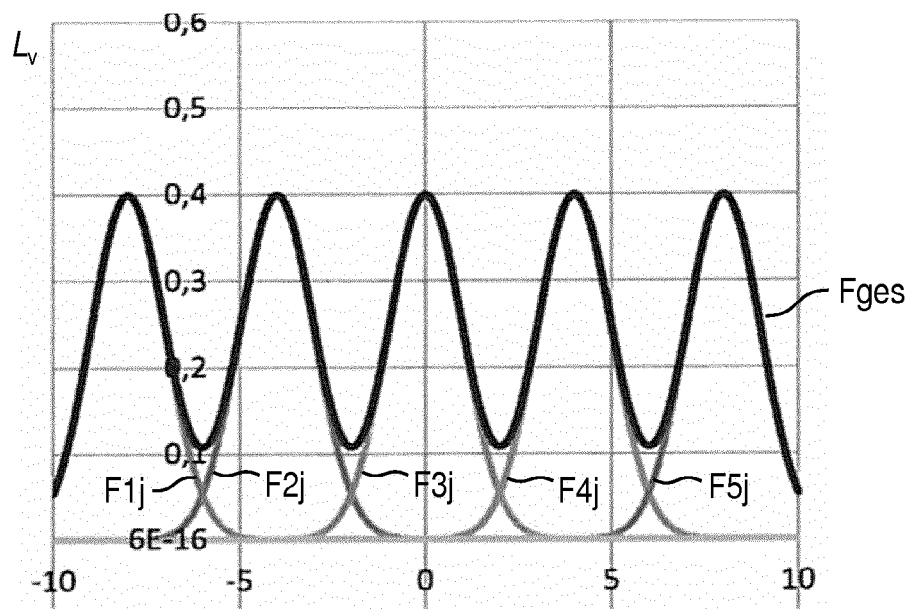
FIG. 3 shows a plot of a local luminance distribution from FIG. 2.

FIG. 3 shows a plot of a local luminance distribution of a line j of the light spots Fij with the columns i=1 to 5 from FIG. 2 and the overall light spot Fges resulting therefrom by superposition.

The light spots Fij are arranged disjointed, since the luminance peaks and/or the geometric centers thereof are not coincident.

The light spots Fij are furthermore locally separated from one another, since they only overlap at a luminance $L_v$ which is less than, for example, 60% or $1/e \approx 36.8\%$ of the maximum value of the luminance $L_v$ of the respective light spots, namely here with regions which have less than 12.5% of the maximum luminance $L_v$. The overall light spot Fges resulting by superposition thus also shows local brightness peaks which are clearly separated from one another, which correspond to the peaks of the individual light spots Fij.

Figure 4:
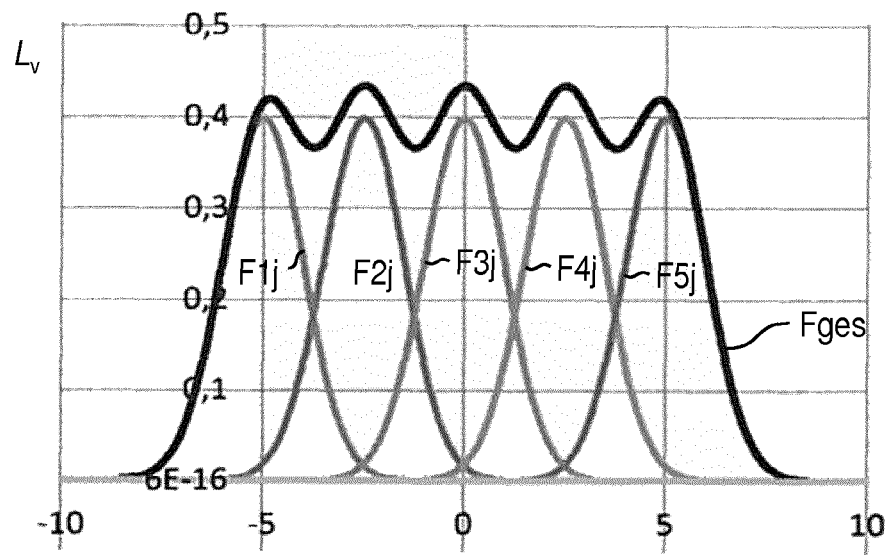
FIG. 4 shows a further plot of a local luminance distribution.

FIG. 4 shows a further plot of a further local luminance distribution of a line j of disjointed light spots Fij with i=1 to 5 and the overall light spot Fges resulting therefrom by superposition.

The light spots Fij overlap here, in contrast to FIG. 3, if the criterion of 1/e of the maximum luminance $L_v$ is assumed as the value of an edge of the light spots Fij. In comparison to FIG. 3, the light spots Fij have, with identical luminance profile or with identical shape of the luminance distribution thereof, a different lateral distance in relation to one another. This also applies similarly to the individual primary light beams Pij at the location of the luminophore element 9. The overall light spot Fges resulting due to superposition thus does still show local brightness peaks which are clearly separated from one another, and which correspond to the peaks of the individual light spots Fij. However, the brightness peaks of the overall light spot Fges are not as pronounced as in FIG. 3.

Figure 5:
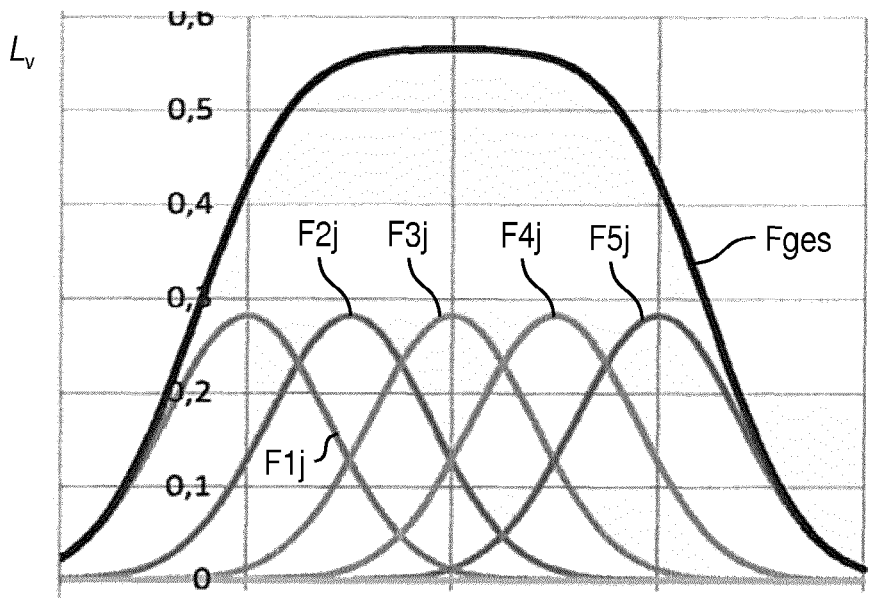
FIG. 5 shows still another possible plot of a local luminance distribution.

FIG. 5 shows still a further plot of a further possible local luminance distribution of a line j of disjointed light spots Fij with i=1 to 5 and the overall light spot Fges resulting therefrom by superposition.

The light spots Fij overlap here even more strongly than in FIG. 4, so that the overall light spot Fges no longer displays any pronounced local luminance maxima. For this purpose, the light spots Fij have a broader luminance profile in comparison to FIG. 4 at equal distance to one another. FIG. 5 thus differs from FIG. 3 both due to the distance and also due to the luminance profile of the light spots Fij.

The shape change of the overall light spot Fges, for example, between the shapes shown in FIG. 3 to FIG. 5, can be performed in operation of the illumination device 11 by this device itself. Thus, in operation, for example, a distance of adjacent light spots Fij and/or the beam width thereof can be changed, for example, by defocusing and/or optionally adding or removing (including replacing) at least one optical element into or from, respectively, the beam path of the light spots Fij.

Figure 6:
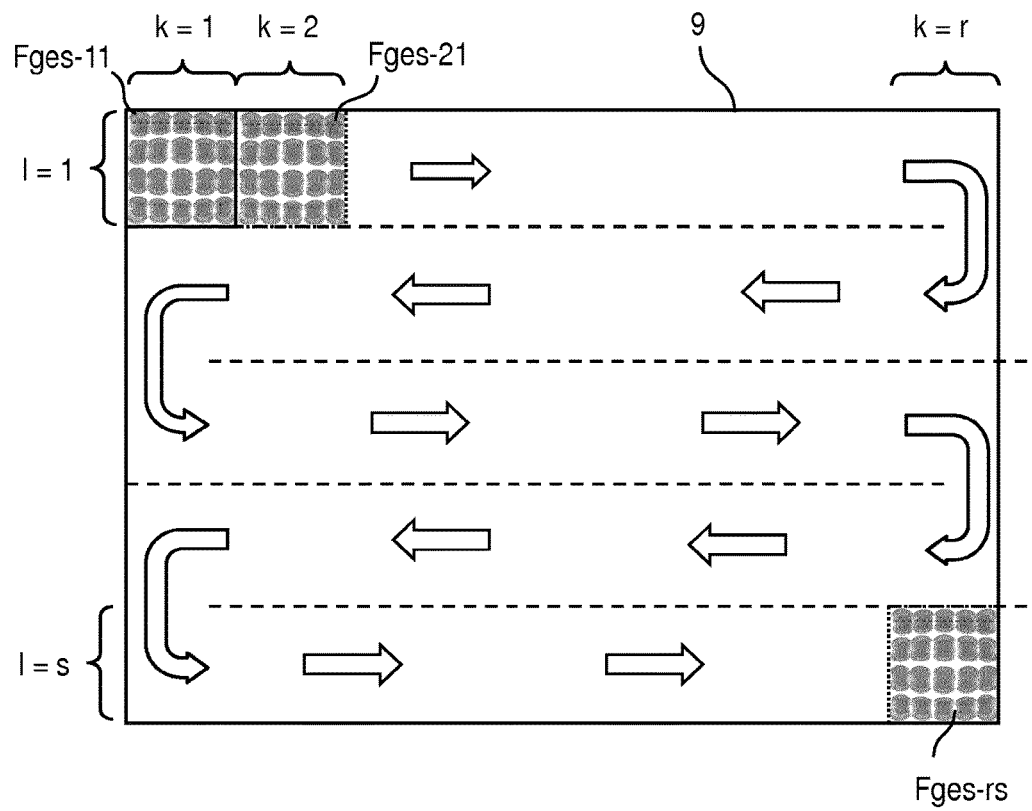
FIG. 6 shows a frontal view of a luminophore element having a possible path of the overall light spot.

FIG. 6 shows a frontal view of a luminophore element 9 having a possible path, solely by way of example, of the overall light spot Fges. The overall light spot Fges is movable in succession by a pivot or rotation of the micromirror 5 over the luminophore element 9 so that the luminophore element 9 can be illuminated line-by-line by the overall light spot Fges. This can also be referred to as line scanning. In this case, multiple lines l=1, . . . , s one under another are illuminated or "scanned", and in each of the l lines, k=1, . . . , r, overall light spots Fges are generated adjacent to one another. Overall, an (r×s) matrix pattern of overall light spots Fges results. For this purpose, the micromirror 5 (or alternatively movable mirrors 5 and/or 7) have at least (r×s) possible angle positions. In this case, the micromirror 5 can be adjustable continuously or practically continuously, so that in principle arbitrary other angle positions can also be assumed.

The overall light spots Fges at the positions k, l (which can also be referred to as Fges-kl hereafter), advantageously directly adjoin one another, but are not overlapping or superimposed, but rather locally separated from one another. The duration which is required to scan the overall light spot Fges over all positions 1, . . . , r and 1, . . . , s is also referred to as the "image buildup time", and the associated frequency as the "image buildup frequency". The image buildup frequency, for sufficiently high chronological resolution of a light emission pattern, also in a far field, is advantageously at least 50 Hz, particularly advantageously at least 75 Hz, particularly advantageously at least 100 Hz, particularly advantageously at least 200 Hz.

The individual light spots Fij form an ([i·k]×[j·l]) matrix pattern on the luminophore element 9. If a beam characteristic of the individual light spots Fij is individually variable, the possibility thus results of providing a high-resolution matrix field of individual light spots Fij and therefore also a corresponding light emission pattern. The special advantage results in this case that to achieve such a high resolution, the micromirror 5 only has to be moved using a coarser step width than the step width required for the resolution of the individual light spots Fij. In other words, with an equally "fine" step width of the mirror, higher luminances (for example, by a longer duration and therefore by a higher time integral) may thus be implemented with a simultaneously higher resolution. This is particularly advantageous for use with an adaptive or active headlight.

The illumination device 1 may include a memory (not shown) or can be coupled to a memory, in which a lookup table is stored, which links each angle position of the micromirror 5 to at least one beam property of the individual light spots Fij or the overall light spot Fges. Therefore, at least one beam property can be assigned individually or in groups to each individual light spot Fij, for example, an individual dimming factor. Alternatively or additionally, at least one specific beam property can be assigned in common to the overall light spot Fges or all individual light spots Fij, for example, a common dimming factor. The linkages between the angle positions and the beam properties can be different for various applications. The illumination device 1 can thus be used as a vehicle headlight, wherein, for example, different linkages for low beams for right-hand traffic, for low beams for left-hand traffic, for low beams according to US definitions, for low beams according to ECE standards, for fog lights, for high beams, etc. can be stored in the lookup table.

It is also possible that the illumination device 1 is coupled to at least one sensor (for example, a camera) and the beam properties of the individual light spots Fij and/or the overall light spot Fges (or the corresponding primary light beams Pij and Pges) is variable depending on a measured value of the at least one sensor. Thus, in a traveling vehicle, when a pedestrian or an animal has been discovered by means of a front camera, the light spots Fij can be dimmed or turned off entirely which illuminate this object in the associated light emission pattern. This reduces dazzling of the object. A situation-dependent adaptation of the beam properties is generally possible. A further possibility for a situation-dependent adaptation may consist of a variation of the dimming factor depending on the value of an external light sensor.

Figure 7:
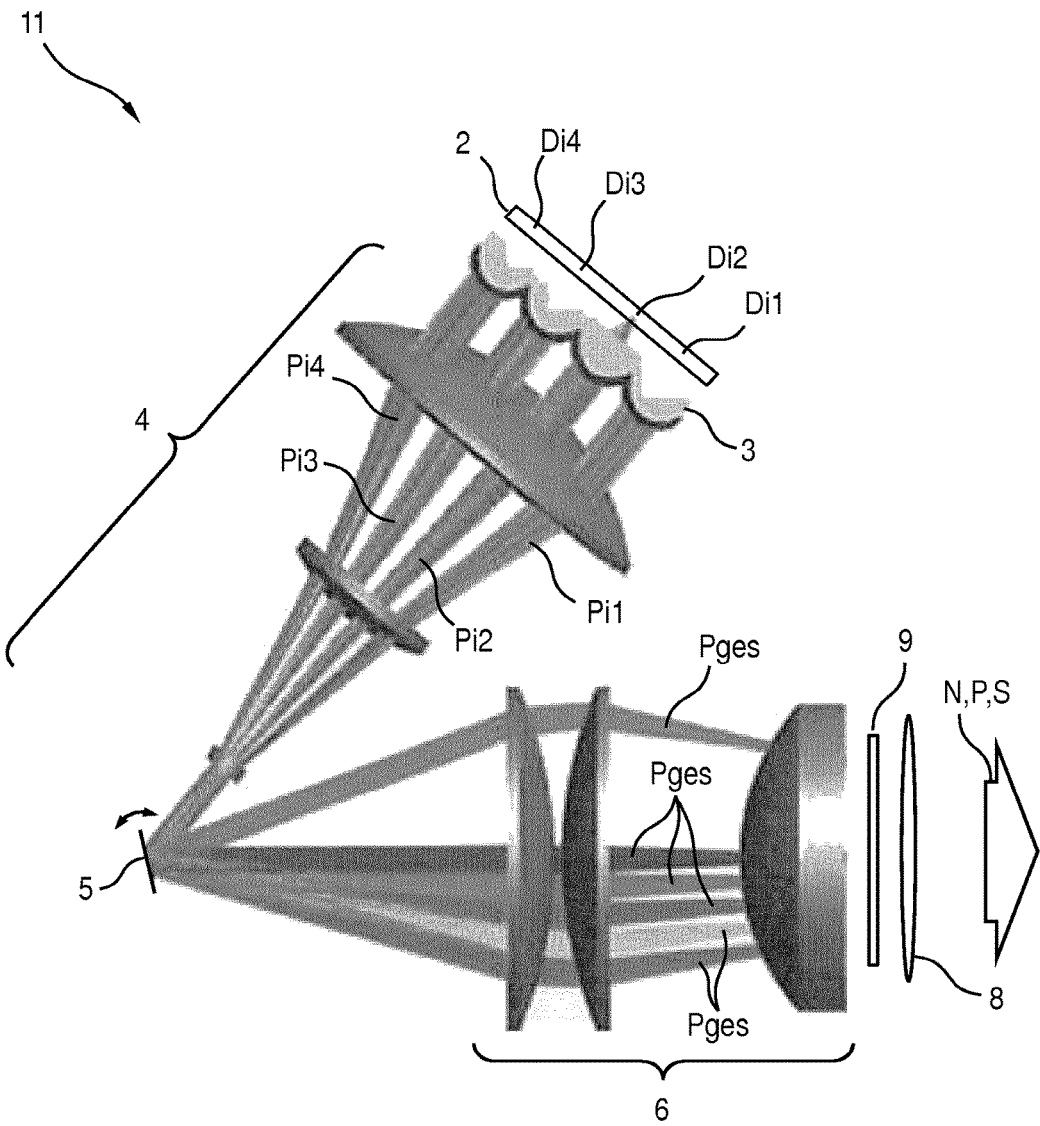
FIG. 7 shows a sectional illustration in a cross-sectional view of an illumination device according to a second embodiment.

FIG. 7 shows a sectional illustration in a cross-sectional view of an illumination device 11 according to a second embodiment.

The illumination device 11 differs from the illumination device in particular in that the, for example, white or whitish useful light N, which corresponds to the mixture of converted secondary light S and nonconverted primary light P, is emitted on the side of the luminophore element 9 facing away from the incident primary light beams Pij. In this "transmitting" or "transmissive" arrangement, the fourth optical unit 8 (which is indicated here by a lens) is also located on the side of the luminophore element 9 emitting the useful light N. The deflection mirror 7 is also omitted here, which is also possible in principle in the illumination device 1, however.

Figure 8:
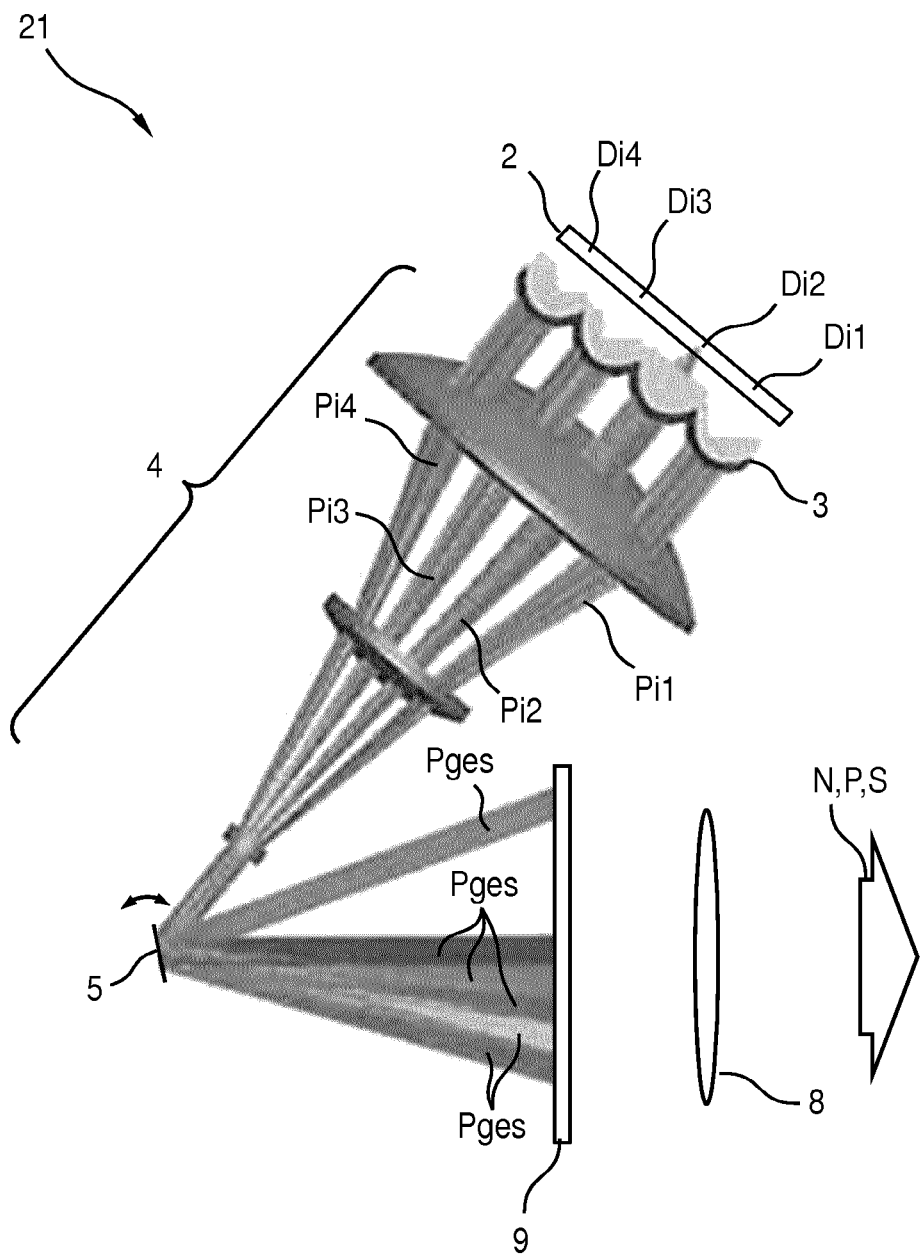
FIG. 8 shows a sectional illustration in a cross-sectional view of an illumination device according to a third embodiment.

FIG. 8 shows a sectional illustration in a cross-sectional view of an illumination device 21 according to a third embodiment.

The illumination device 21 differs from the illumination device 11 in that the third optical unit 6 is omitted. While in the illumination devices 1 and 11, inter alia, focusing of the primary light beams Pij incident on the luminophore element 9 is performed by the third optical unit 6, the second optical unit 4 assumes this in the illumination device 21. It therefore no longer has to be embodied as "telescopic".

The six different overall primary light beams Pges shown in FIG. 1, FIG. 7, and FIG. 8 can each generate different overall light spots Fges-kl and can therefore also be referred to as overall primary light beams Pges-kl.

Although the present disclosure was illustrated and described in greater detail by the embodiments shown, the present disclosure is not thus restricted thereto and other variations can be derived therefrom by a person skilled in the art, without leaving the scope of protection of the present disclosure.

The primary light beams Pij can thus also be incident diagonally on the luminophore element. It can also be inclined so that the primary light beams Pij are incident thereon at least approximately at a Brewster angle.

A luminophore element can also in general be able to be illuminated by multiple sets, each made of multiple semiconductor primary light sources and at least one movable mirror as described above. The areas of the luminophore element which can be illuminated and which are associated with various sets can in particular be locally disjointed. Alternatively, a common area of the luminophore element may also be illuminated in a chronologically and/or locally offset manner by the sets. In the case of the locally offset illumination, a luminophore element can be illuminated by different sets in particular on different tracks or on the same track (for example, in opposite directions). In the case of the only chronologically offset illumination, a luminophore element can be illuminated by different sets, in particular on the same track in the same direction.

In addition, instead of a line-by-line scanning, a column-by-column, Lissajous-type, or still other scanning can also be carried out.

In general, "a", "one", etc. can be understood as a single one or a plurality, in particular in the sense of "at least one" or "one or multiple", etc., as long as this is not explicitly precluded, for example, by the expression "precisely one" etc.

A numeric specification can also include precisely the specified number and also a routine tolerance range, as long as this is not explicitly precluded.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

REFERENCE SIGNS 1 illumination device
2 multi-die package
3 first optical unit
4 second optical unit 5 micromirror
6 third optical unit
7 deflection mirror
8 fourth optical unit
9 luminophore element
11 illumination device
21 illumination device
Dij laser chip
Fges overall light spot
Fges-kl overall light spot at position (k,l)
Fij individual light spot
N useful light
P primary light component
Pges overall light beam
Pij primary light beam
S secondary light beam
U envelope contour

The invention claimed is:

1. An illumination device, comprising:
a plurality of semiconductor primary light sources for emitting respective individual primary light beams, the plurality of semiconductor primary light sources are arranged in a two-dimensional pattern;
at least one movable mirror, which can be illuminated by means of the primary light beams, and which can assume a plurality of angle positions;
at least one luminophore element, which can be illuminated by means of the primary light beams deflected by the at least one mirror; and
an actuator configured to position the at least one mirror to each of the plurality of angle positions,
wherein
for each angle position of the at least one mirror, only a portion of the at least one luminophore element is illuminated by the deflected primary light beams,
each illuminated portion of the at least one luminophore element comprises an overall light spot, a respective position of each overall light spot on the at least one luminophore element corresponding to a respective one of the angle positions of the at least one mirror,
each overall light spot comprises a plurality of individual light spots corresponding to the plurality of the individual primary light beams incident on the respective illuminated portion of the at least one luminophore element, each overall light spot has a planar extension which does not exceed 20% of a corresponding planar extension of the at least one luminophore element, and
the plurality of angle positions comprise a chronological sequence of angle positions of the at least one mirror driven by the actuator to thereby generate a chronological sequence of respective overall light spots on the at least one luminophore element, wherein the sequence of respective overall light spots comprises a scan path.

2. The illumination device as claimed in claim 1, wherein at least one beam property of at least one primary light beam incident on the at least one luminophore element is variable during operation of the illumination device.

3. The illumination device as claimed in claim 2, wherein the at least one beam property comprises an irradiance of the individual primary light beam.

4. The illumination device as claimed in claim 3, wherein the irradiance of each individual primary light beam is dependent on the angle position of the least one mirror.

5. The illumination device as claimed in claim 2, wherein the at least one beam property comprises an irradiance distribution of the primary light beams.

6. The illumination device as claimed in claim 2, wherein the at least one beam property comprises a cross-sectional area or beam width of the primary light beam or a distance between two adjacent primary light beams.

7. The illumination device as claimed in claim 2, wherein the at least one beam property of at least one primary light beam varies based on the angle position of the at least one mirror.

8. The illumination device as claimed in claim 2, wherein the at least one movable mirror comprises at least one micromirror rotatable about an x axis and a y axis.

9. The illumination device as claimed in claim 2, wherein the overall light spots, each associated with a different angle position, are locally separated from one another.

10. The illumination device as claimed in claim 2, wherein the at least one variable beam property of at least one primary light beam comprises the activation and/or deactivation of the respective semiconductor primary light source based on the respective angle position.

11. The illumination device as claimed in claim 2, wherein a first overall light spot of the sequence corresponds to a first angle position of the at least one mirror and a second overall light spot of the sequence corresponds to a second angle position of the at least one mirror, the first overall light spot and the second overall light spot are spatially adjacent to each other and non-overlapping.

12. The illumination device as claimed in claim 2, wherein a first overall light spot of the sequence corresponds to a first angle position of the at least one mirror and a second overall light spot of the sequence corresponds to a second angle position of the at least one mirror, the first overall light spot and the second overall light spot are successively generated and at least partially overlap with one another spatially with a chronological offset.

13. The illumination device as claimed in claim 12, wherein one or more individual light spots of the first overall light spot and one or more individual light spots of the second overall light spot are positioned to completely overlap and be superposed chronologically.

14. The illumination device as claimed in claim 2, wherein at least two of the plurality of individual light spots of the overall light spot are locally differentiable on the at least one luminophore element.

15. The illumination device as claimed in claim 2, wherein each semiconductor primary light source is independently operable.

16. The illumination device as claimed in claim 2, wherein the sequence of respective overall light spots comprises a light emission pattern, wherein the plurality of individual light spots of each overall light spot comprises a matrix having a width i and a length j, wherein the light emission pattern comprises a matrix having a width i·k and a length j·l, where i, j, k, l are integers greater than zero.

17. The illumination device as claimed in claim 2, wherein the sequence of respective overall light spots is generated within an image buildup time and comprises a light emission pattern, wherein a luminance of a particular light spot of the light emission pattern comprises a chronologically integrated luminance of at least two individual light spots generated during the image buildup time, the at least two individual light spots provided on the at least one luminophore element in the same position as the particular light spot on the at least one luminophore element so as to superpose chronologically.

18. The illumination device as claimed in claim 2, further comprising:

a plurality of primary optical units arranged in a one to one correspondence with the plurality of semiconductor primary light sources, each primary optical unit is configured to shape the primary light beam emitted from a respective semiconductor primary light source.

19. The illumination device as claimed in claim 18, wherein each primary optical unit is configured to collimate the respective individual primary light beam so that the individual primary light beams are parallel to each other.

20. The illumination device as claimed in claim 18, further comprising:
at least one telescope optical unit disposed between the plurality of primary optical units and the at least one movable mirror, the at least one telescope optical unit is configured to reduce the spatial distance between each of the primary light beams so that the plurality of primary light beams comprises an overall light beam.

* * * * *